(12) United States Patent
Liu et al.

(10) Patent No.: US 10,636,932 B2
(45) Date of Patent: Apr. 28, 2020

(54) SENSING APPARATUS

(71) Applicant: EPISTAR CORPORATION, Hsinchu (TW)

(72) Inventors: Hsin-Mao Liu, Hsinchu (TW); Hung-Chi Wang, Hsinchu (TW); Zong-Xi Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/984,950

(22) Filed: May 21, 2018

(65) Prior Publication Data

US 2019/0355863 A1 Nov. 21, 2019

(51) Int. Cl.
| | | |
|---|---|---|
| H01L 31/12 | (2006.01) | |
| H01L 31/153 | (2006.01) | |
| H01L 31/0352 | (2006.01) | |
| H01L 49/02 | (2006.01) | |
| H01L 31/024 | (2014.01) | |
| H01L 31/0224 | (2006.01) | |
| H01L 31/109 | (2006.01) | |

(52) U.S. Cl.
CPC ............ *H01L 31/125* (2013.01); *H01L 28/20* (2013.01); *H01L 28/40* (2013.01); *H01L 31/024* (2013.01); *H01L 31/022408* (2013.01); *H01L 31/03529* (2013.01); *H01L 31/109* (2013.01); *H01L 31/153* (2013.01)

(58) Field of Classification Search
CPC ....... H01L 31/125; H01L 28/20; H01L 28/40; H01L 31/022408; H01L 31/024; H01L 31/03529; H01L 31/109; H01L 31/153
USPC .................................. 356/432–448, 213–236
See application file for complete search history.

(56) References Cited

U.S. PATENT DOCUMENTS

| | | | |
|---|---|---|---|
| 2009/0101919 A1* | 4/2009 | Yao | H01L 27/14603 257/85 |
| 2010/0072457 A1* | 3/2010 | Iguchi | B82Y 20/00 257/21 |
| 2012/0082283 A1* | 4/2012 | Popa-Simil | G01T 1/204 376/245 |
| 2018/0128774 A1* | 5/2018 | Kashyap | G01N 27/02 |

* cited by examiner

*Primary Examiner* — Tri T Ton
(74) *Attorney, Agent, or Firm* — Patterson + Sheridan, LLP

(57) ABSTRACT

A sensing apparatus includes a sensing device having a hetero-junction structure, a light coupler connected to the sensing device and a readout device connected to the light coupler.

12 Claims, 4 Drawing Sheets

SENSING APPARATUS

TECHNICAL FIELD

The present disclosure relates to a sensing apparatus having a sensing device and in particular to a sensing device having a hetero-junction structure.

DESCRIPTION OF THE RELATED ART

The development of a sensing apparatus capable of obtaining precise information is required in all aspects. Particularly, efforts are devoted to developing high precision, low power consumption and low cost sensing apparatus. The sensing apparatus has been implemented to detect pollution in living spaces, and industrial environment, etc.

The preciseness of a sensing apparatus is majorly relying on the preciseness of the readout device within the sensing apparatus. The readout device provides a readout signal to show if the sensing apparatus senses the specific element or to show the level of the specific element, especially to show the concentration of the specific element.

However, the preciseness of the sensing apparatus is affected by the performance of the readout device. For example, the resistor of the readout device is designed to be matched with that of the sensing device, and the variation of the resistor of the sensing apparatus, from external change of specific element, can be precisely shown by the readout device. However, in reality, the resistor of the sensing apparatus is not a fixed value. For example, the resistor of a transistor as a sensing device operated in a linear region in a low voltage is different from that in a higher voltage, and the resistor of the readout device cannot be designed to match with both values. So the match of the resistors between the readout device and the sensing device is unable to be performed perfectly.

In another aspect, while the sensing device is operated to detect a target element with low concentration, the noise and the real signal are hard to be distinguished from each other. Therefore, the accurate value or level of the element, such as gas, cannot be derived correctly.

It is an object of the current disclosure to provide a sensing apparatus with a readout device to improve the preciseness.

SUMMARY OF THE DISCLOSURE

The following description illustrates embodiments and together with drawings to provide a further understanding of the disclosure described above.

A sensing apparatus includes a sensing device having a hetero-junction structure, a light coupler connected to the sensing device and a resistor connected to the light coupler.

A sensing apparatus includes a sensing device having a hetero-junction structure, a light coupler having an LED connected to the sensing device and a light receiver, a first capacitor connected with the LED in parallel, a resistor connected to the light coupler, and a second capacitor connected with the resistor in series.

A sensing apparatus includes a sensing device, a light coupler, a first capacitor, a resistor and a second capacitor. The sensing device has a hetero-junction structure, a heater and a passivation layer sandwiched by the heater and the hetero-junction structure. The light coupler has an LED connected to the sensing device. The first capacitor is connected to the LED. The resistor is connected to the light coupler. The second capacitor connected to the resistor.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should have the same or equivalent meanings while it is once defined anywhere in the disclosure. The thickness or the shape of an element in the specification can be expanded or narrowed.

Figure 1A:
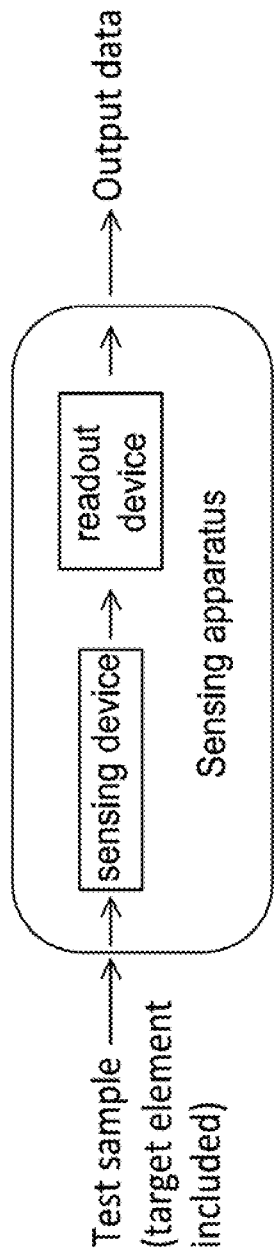
FIG. 1A shows a process flow of sensing in accordance with an embodiment of the present disclosure.

FIG. 1A shows a process flow of sensing in accordance with an embodiment of the present disclosure. A sensing apparatus is provided to detect a target element within a test sample. To be more specific, a sensing apparatus is exposed to an environmental medium (for example, air, exhaust gas, liquid) which includes target element, the target element can react with the sensing device and a detection signal is generated to be delivered to the readout device. For example, the detection signal is a current signal having a base signal and a variation signal. Then, the sensing apparatus provides a readout signal from the readout device to show if the sensing apparatus sense the target element or to show the level of the target element. In an embodiment, the sensing apparatus shows the concentration of the target element within the test sample.

Figure 1B:
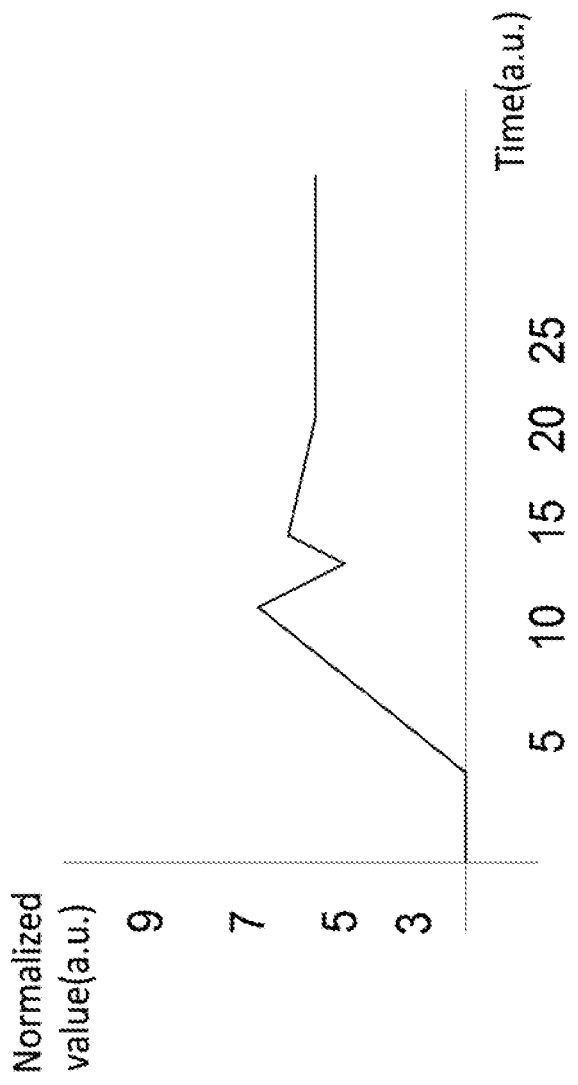
FIG. 1B shows a waveform of a detection signal during operation of a sensing apparatus in accordance with an embodiment of the present disclosure.

FIG. 1B shows a waveform of a detection signal during operation of a sensing apparatus in accordance with an embodiment of the present disclosure. The value of the detection signal is 0 during 0~5 (a.u.) before sensing the target element. The value of the detection signal increases from 0 to 7 (a.u.) during time interval of 5~10 (a.u.) after detecting the target element. The value of the signal then varies within 5~7 (a.u.) during a time interval of 10~20 (a.u.) and to be stabilized after time of 20 (a.u.). In an embodiment, the difference of value between 5 (a.u.) and 7 (a.u.) is less than 10 uA. To sum up, FIG. 1B shows the value of the detection signal is increased to a higher level in the beginning of operation, decreased to a lower level after reaching a maximum value and slightly increased and kept stable at a medium level. The trend of the value of the detection signal having a sequence of increasing, decreasing, and increasing (to a stable status) can be the same, but the time periods of different status can be different in different sensing conditions. The time periods of the value of the detection signal related to different status can be varied. For example, the value of the detection signal can be increased during time interval of 1~3 (a.u.) and to be stabilized after time of 8 (a.u.). In reality, the concentration of the target element within the test sample cannot be predicted.

The target element can be $H_2$, $NH_3$, CO, $SO_x$, NO, $NO_2$, $CO_2$, $CH_4$, acetone, ethanol, formaldehyde, benzene such as toluene, etc. The test sample can exist in the form of gas or liquid.

Figure 2:
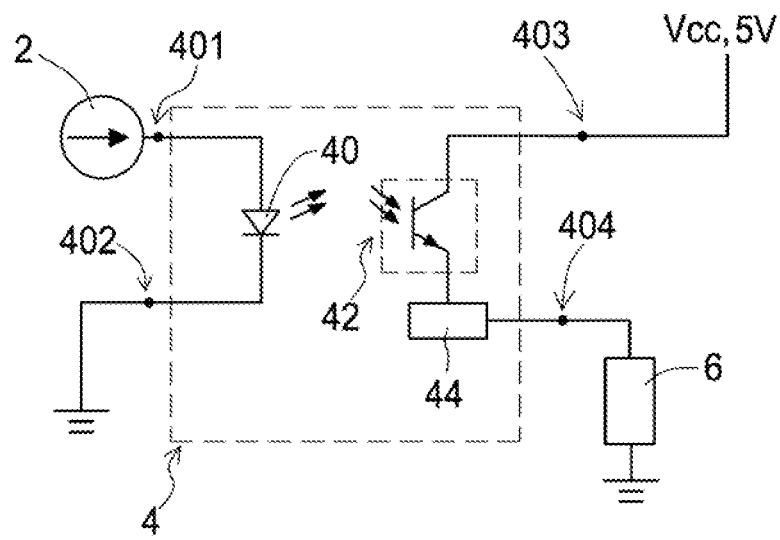
FIG. 2 shows a schematic view in accordance with an embodiment of the present disclosure.

FIG. 2 shows a schematic view in accordance with an embodiment of the present disclosure. A sensing device 2 is connected to a light coupler 4. The sensing device 2 senses the target element and generates a detection signal to the light coupler 4. The light coupler 4 has a LED 40 electrically connected to the sensing device 2, a light receiver 42 separated from the LED 40 and an amplifier 44 electrically connected to the light receiver 42. In an embodiment, the light receiver 42 is arranged to be directly contacted with the LED 40. The light coupler 4 has four connection ports. The first port 401 is connected to the sensing device 2. The second port 402 is connected to a ground power line. The third port 403 is connected to a power source Vcc. The fourth port 404 is connected to a readout device 6. In an embodiment, the power source Vcc provides a DC voltage of 5V. The LED 40 connected between the first port 401 and the second port 402 receives the detection signal from the sensing device 2 (for example, in a form of current), and generates a light according to the detection signal, wherein the detection signal has a base signal and a variation signal. The light travels to the light receiver 42 through air. The light receiver 42 is physically separated from the LED 40 but optically coupled to the LED 40. The light receiver 42 is connected to the third port 403. In an embodiment, a light guide, such as an optical fiber, is physically or optically connected between the LED 40 and the light receiver 42 to transmit the light and avoid decrease of light intensity while transmitting. In an embodiment, a reflector is formed within the light coupler 4 to concentrate the light emitted from the light LED 40. The light receiver 42 receives the light and generates a current signal to the amplifier 44. In an embodiment, the current signal has a base current signal and a dependent current signal. To be more specific, the base current signal and the dependent current signal are respectively generated from the base signal and the variation signal of the detection signal. The amplifier 44 is connected between the light receiver and the fourth port 404. The amplifier 44 enlarges the current signal. In an embodiment, the amplifier 44 receives a base signal of 0.05 mA and enlarges the base signal to be 0.5 mA. The enlarged current signal is transmitted to the readout device 6. The readout device 6 is connected between the fourth port 404 and a ground power line. The readout device 6 transforms the enlarged current signal to a voltage signal.

Figure 3:
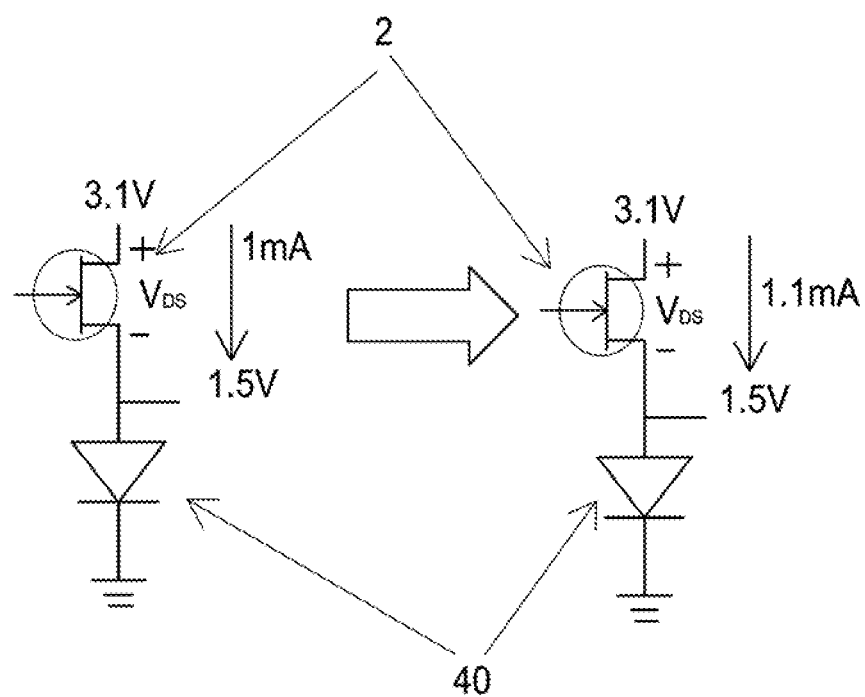
FIG. 3 shows schematic view in accordance with an embodiment of the present disclosure.

FIG. 3 shows a schematic view in accordance with an embodiment of the present disclosure. The configuration in FIG. 3 is to describe the procedure of sensing a target element. As shown in FIG. 3, the sensing device 2 is a field effect transistor. In this embodiment, the drain electrode of the sensing device 2 is connected to a power source having a value of 3.1V, the source electrode of the sensing device 2 is connected to an LED 40, and the gate portion of the sensing device 2 is configured to sense a target element. The sensing device 2 can be a metal-semiconductor FETs (MES-FETs) or a high electron mobility transistor (HEMT). For example, the sensing device 2 is a depletion mode HEMT.

In an embodiment, the sensing device 2 is an enhancement mode HEMT. In status 1, as shown in the left part of FIG. 3, the sensing device 2 is turned on and provides a current of 1 mA to the LED 40. The LED 40 emits a light while receiving the current and a voltage value of 1.5V is detected at a node between the sensing device 2 and the LED 40. In status 2, as shown in the right part in the figure, the concentration of the target element is increased. Then, the sensing device 2 is affected by the target element, and the target element changes the amount of the net surface charge on the sensing area of the sensing device 2. To be more specific, the surface charge on the gate electrode portion of the sensing device 2 is affected by the target element. Therefore, electron density in the 2DEG channel within the sensing device 2 is changed. To be more specific, the amount of the net surface charge and electron density in the 2DEG channel within the sensing device 2 are increased. The current provided by the sensing device 2 is then increased to 1.1 mA, and the intensity of the light from the LED 40 is therefore increased. Meanwhile, the voltage detected between the sensing device 2 and the LED 40 is kept without further changing the operation condition of the sensing device 2 between status 1 and status 2. That is, the variation of the current provided by the sensing device 2 is totally arisen from the change of the concentration of the target element.

To be more specific, the sensing device 2 is designed to be operated at a saturation region where the voltage difference between the drain electrode and the source electrode of sensing device 2 is not sensitive to the change of the current. For example, the variation of the drain-source current is less than 0.05 A with a voltage variation of voltage difference between the drain electrode and the source electrode is not less than 3V.

The target element is $H_2$, $NH_3$, CO, $SO_x$, NO, $NO_2$, $CO_2$, $CH_4$, acetone, ethanol, formaldehyde, benzene such as toluene, etc. The target element can be detected in the form of gas or liquid.

Figure 4:
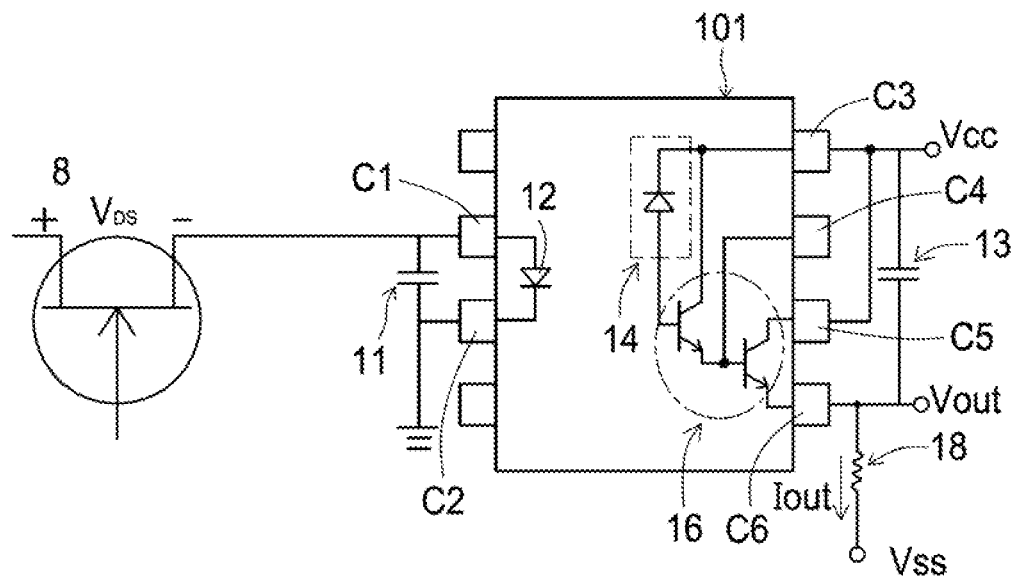
FIG. 4 shows a schematic view in accordance with an embodiment of the present disclosure.

FIG. 4 shows a schematic view in accordance with an embodiment of the present disclosure. A sensing apparatus 100 includes a sensing device 8, capacitor 11, 13, an LED 12, a light receiver 14, an amplifier 16 and a readout device 18. The LED 12, the light receiver 14, and the amplifier 16 are integrated in a chip 101. The chip 101 has six nodes C1~C6 connected to elements and tow floating nodes. The chip 101 has a first node C1 connected to the sensing device 8, the LED 12 and the capacitor 11. The capacitor 11 is used to filter out the noise of the detection signal from the sensing device 8. Moreover, the capacitor 11 and the LED 12 are connected in parallel through a first node C1 and a second node C2 of the chip 101. The second node C2 is connected to a ground power line. Inside the chip 101, the LED 12 emits a light to the light receiver 14 according to the detection signal from the sensing device 8. The light receiver 14 is connected to a power source Vcc through the third node C3. The amplifier 16 is connected to the power source Vcc through the third node C3 and the fifth node C5. The light receiver 14 generates a current signal to the amplifier 16, and the amplifier 16 enlarges the current signal. The current signal has a base current signal and a dependent current signal. It is noted, the amplifier 16 includes two bipolar junction transistors (BJTs), and the connection node between the two BJTs is connected to a fourth node C4. The amplifier 16 is connected to the light receiver 14, the power source Vcc through the third node C3 and the fifth node C5, and the readout device 18 through the sixth node C6. The readout device 18 is connected between an output end Vout and a power source Vss. In an embodiment, the capacitor 11 is formed between the node C1 and the power source Vcc. Therefore, the value of the output end Vout can be derived by a formula:

Vout=Vss+Iout*Rout, wherein the "Rout" represents the resistance value of the readout device 18, and the current "Iout" represents the current passing through the readout device 18. The current signal including a base current signal and a dependent current signal is then enlarged by the amplifier 16 and transmitted to the readout device 18. The readout device 18 transforms the enlarged current signal to be a voltage signal V-ch1. To be more specific, the current signal is enlarged by two BJTs in the amplifier 16. In an embodiment, the fourth node C4 is further connected to another readout circuit to transform a current signal which is enlarged only by one BJT in the amplifier 16 to be another voltage signal V-ch2. That is, the chip 101 is able to provide a one channel output form through the node C6 or a two channel output form through the nodes C4 and C6.

In one channel output form, the readout device 18 transforms the enlarged current signal to be a voltage signal V-ch1 through two BJTs. The readout device 18 is connected to the node C6 to generate a read out value of a voltage signal V-ch1. In two channel output form, a readout device (not shown) other than the readout device 18 is provided to connected to the node C4 to transform the current signal from the light receiver 14 to be a voltage signal V-ch2 through one BJT. In other words, the current signal is enlarged once through the path to the node C4 while the current signal is enlarged twice through the path to the node C6. Therefore, the voltage signal V-ch2 is smaller than V-ch1 if connected to resistors with the same resistance (or same readout circuit). In an embodiment, in order to derive the same voltage value, the readout circuit connected to the node C4 has a resistance more than that of the readout circuit connected to the node C6. In one channel output form, only one output voltage signal V-ch1 from node C6 can be used for further operation, such as triggering alarm system or showing the concentration of the specific element. In two channel output form, two output voltage signals V-ch1 and V-ch2 from nodes C4 and C6 can be used for different operation purposes at the same time without disturbing with each other.

In one channel output form, the power source Vss and the power source Vcc can be adjusted according to the characteristics of the light receiver 14 and the amplifier 16. In an embodiment, the power source Vss has a value of −5V, and the power source Vcc has a value of +5V. The value of the current signal can be derived through the output end Vout as a read out value of a voltage signal V-ch1. The capacitor 13 connected between the power source Vcc and the output end Vout is used to stabilize the output voltage of the output end Vout to avoid variation during measuring. The variation can be arisen from variation of the power source Vcc, Vss. In an embodiment, a read out adjustment device is connected to the sensing apparatus 100 to translate the read out value of the voltage signal V-ch1 on the readout device 18 to a value of concentration. For example, a read out value of 30 mV measured on the readout device 18 is translated to a concentration of 100 ppm.

The sensing device 8 applied is functioned as a current source which can change its output in response to the concentration variation of the target element. The sensing device 8 can be a packaged semiconductor element or a sensor in a form of an epitaxial layer or epitaxial layers. The semiconductor element can be selected from the group consisting of a metal-oxide-semiconductor FET (MOSFET), a metal-semiconductor FETs (MESFETs), and a high electron mobility transistor (HEMT). In an embodiment, the semiconductor element comprises $WO_x$, $SnO_x$, $InO_x$, $ZnO_x$ or $TiO_x$.

Figure 5:
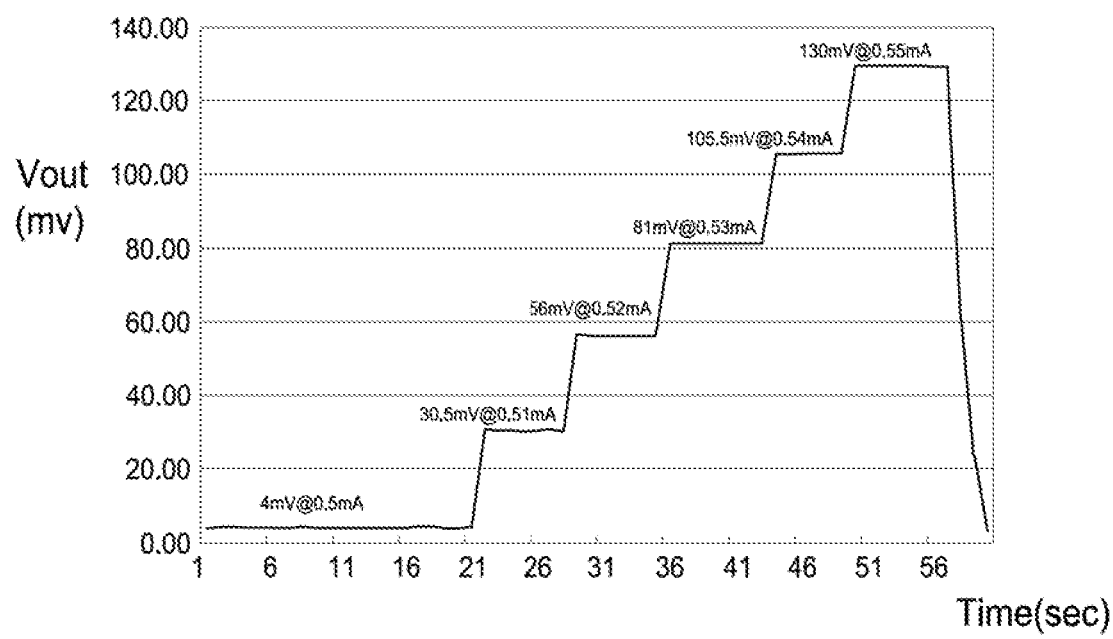
FIG. 5 shows a waveform of a read out value during operation in accordance with an embodiment of the present disclosure.

FIG. 5 shows a waveform of a read out value during operation in accordance with an embodiment of the present disclosure. The waveform in FIG. 5 shows the read out value of the sensing apparatus 100 operated to detect a target element with an increasing concentration. For example, the Vout (mV) in FIG. 5 is related to the voltage value of the node C6 (or the Vout) shown in FIG. 4. In the initial stage, the read out value is 4 mV during 0~21 sec, wherein a corresponding detection signal from the chip 101 is 0.5 mA. In other words, the detection signal of 0.5 mA is consisted of a base signal of 0.5 mA and a variation signal of 0 mA. The concentration of the target element is then increased. The read out value is enhanced after sensing the increased concentration of the target element. The read out value is increased to be 30.5 mV with a corresponding detection signal from the chip 101 of 0.51 mA and the read out value is stable at 22 sec. In this status, the detection signal of 0.51 mA is consisted of a base signal of 0.5 mA and a variation signal of 0.01 mA. In the following steps, the read out value is increased and stable at 56 mV, 81 mV, 105.5 mV and 130 mV with corresponding detection signal at 0.52 mA, 0.53 mA, 0.54 mA and 0.55 mA. In other words, the read out value is increased with a base signal of 0.5 mA and corresponding variation signal of 0.02 mA, 0.03 mA, 0.04 mA and 0.05 mA. Referring to FIG. 5, the increasing rates of the read out values and the detection signals are not fixed values. For example, the read out value increases by a 20 mV for 0.01 mA increment of the detection signal.

Figure 6:
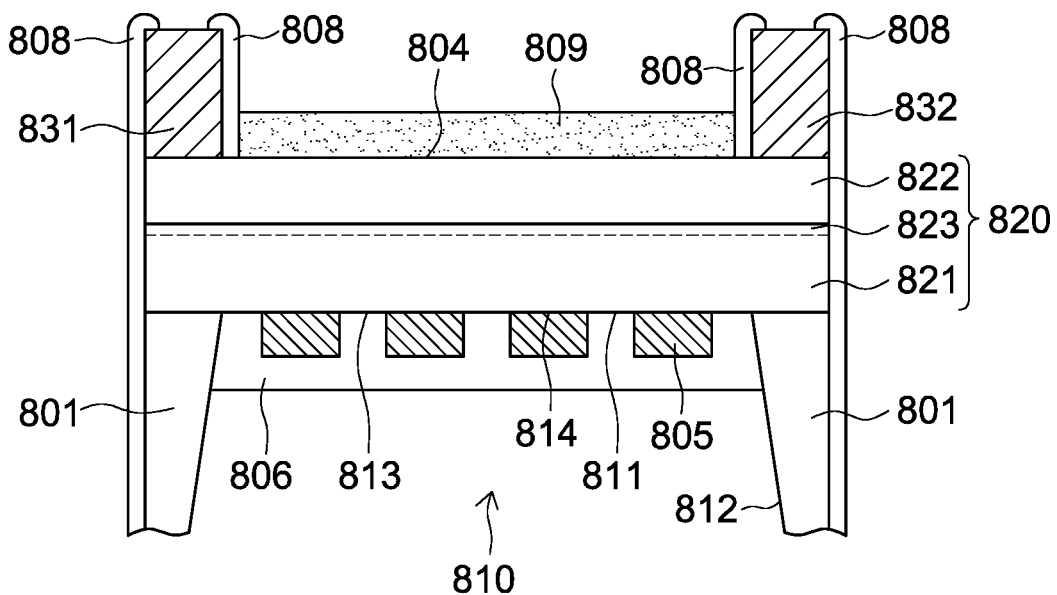
FIG. 6 shows a cross-sectional view of a sensing device in accordance with an embodiment of the present disclosure.

FIG. 6 shows a cross-sectional view of a sensing device in accordance with an embodiment of the present disclosure. Referring to FIG. 6, the sensing device 80 includes a substrate 801, a hetero-junction structure 820 formed on the substrate 801, a source electrode 831 and a drain electrode 832 located on the hetero-junction structure 820, a sensing area 804 on the top side of the hetero-junction structure 820, a functionalization layer 809, an insulating layer 808, a passivation layer 806, and a heater 805 located on the backside of the hetero-junction structure 820. The sensing device 80 is operated as a transistor having a floating gate end without connecting any power source, and the functionalization layer 809 is functioned as a gate portion of the transistor. In an embodiment, the functionalization layer is functioned as a gate electrode. The trench 810 within the substrate 801 is directly formed below the sensing area 804.

As shown in FIG. 6, the smallest width of the trench 810 refers the width at the top side 811 of the trench 810. The sensing area 804 above the trench 810 is fully overlapped with the trench 810. The trench 810 locates at the center of the sensing device 80. The trench 810 has a shape substantially similar with the shape of the sensing area 804 in a top view or a bottom view. The shape can be a rectangle or a square.

The depth of the trench 810 is substantially the same as the thickness of the substrate 801. The substrate 801 has an inner surface 812 surrounding the trench 10 and is inclined relative to the top side 811 of the trench 810. The width of the trench 810 increases from the top side 811 in a direction away from the sensing area 804 in a cross-sectional view. In an embodiment, the inner surface 812 is perpendicular to the top side 811 and the width of the trench 810 is substantial the same from the top side 811 in a direction away from the sensing area 804 in a cross-sectional view. The material of the substrate 801 is suitable for epitaxial growth, such as sapphire ($Al_2O_3$), silicon carbide (SiC), or silicon (Si). In an embodiment, the substrate 801 is made of silicon (Si) and has a thickness between in a range of 200~400 μm, for example 300 μm.

A heater 805 is formed on the top side 811 of the trench 810. The first portion 813 exposed while the second portion 814 is covered by the heater 805. The heater 805 is applied to increase the temperature of the functionalization layer 809 and the sensing area 804. In an embodiment, no additional bonding material or adhesive material is formed between the heater 805 and the hetero-junction structure 820. The responding time and accuracy while sensing the target element of the functionalization layer 809 and the sensing area 804 are shorter and more correct while operating in a higher temperature (without affecting the operation of the hetero-junction structure 820). The target element on the sensing area 804 can be removed by heating to recover the status of the functionalization layer 809 and the sensing area 804. The heater 805 generates heat by receiving current. The shortest distance between the heater 805 and the sensing area 804 is less than 500 nm, for example 350 nm or 300 nm. The heater 805 is made of the material with the higher thermal conductivity, higher electrical resistivity, and lower coefficient of thermal expansion, such as Molybdenum (Mo), Polysilicon, silicon carbide, Ti, Ni, Platinum (Pt), Au, Al, Tungsten (W), $SnO_2$, alloy thereof, or combinations thereof. The resistivity of the heater 805 is between 40~120 ohm, for example 50~100 ohm, 60 ohm, or 74 ohm. The thickness, width, and length of the heater 805 depend on the resistivity of the material of the heater. In an embodiment, the thickness of the heater has a range of the 1~10 μm, for example 2~5 μm, or 3 μm.

A passivation layer 806 covers the heater 805. The passivation layer 806 protects the heater 805 from water or air to enhance the operation lifetime of the heater 805. The passivation layer 806 fully covers the trench 810 (including the first portion 813 and the second portion 814). The passivation layer 806 is fully overlapped with the trench 810 in the bottom view or the top view. The passivation layer 806 includes an insulative material. The dielectric material can be $SiO_2$ or $SiN_x$.

The hetero-junction structure 820 includes a first semiconductor layer 821, a second semiconductor layer 822, and a 2DEG channel 823. The first semiconductor layer 821 and the second semiconductor layer 822 are made of piezoelectric materials and have different bandgaps. The 2DEG channel 823 can be formed at/around the interface of the first semiconductor layer 821 and the second semiconductor layer 822 because of the piezoelectric and spontaneous polarization effects induced there between. The first semiconductor layer 821 and the second semiconductor layer 822 can be made of gallium nitride (GaN), AlN, AlGaN, $Al_yIn_zGa_{(1-z)}N$ (0<y<1, 0<z<1), or etc. In an embodiment, the first semiconductor layer 821 includes GaN and the second semiconductor layer 22 includes aluminum gallium nitride ($Al_xGa_{(1-x)}N$), x=0.05~1. The material of the hetero-junction structure 820 can be selected from AlGaN/InGaN/GaN, AlN/GaN, AlN/InGaN/GaN, AlGaAs/GaAs, AlGaAs/InGaAs, InAlAs/InGaAs, and InGaP/GaAs. The first semiconductor layer 821 has a thickness of a range 150~300 nm, for example 200 nm. The second semiconductor layer 822 has a thickness of a range 15~45 nm, for example 25~35 nm.

The sensing area 804 is separated from the electrodes 831, 832 by an insulating layer 808. The electrode 831 or 832 has a thickness of 2~5 μm, for example, 3 μm. The electrode 831 or 832 can be selected from Au, Cu, Ti, Ni, Al, Pt, alloy thereof, and a combination thereof. The insulating layer 808 can be constructed by one or more dielectric materials, such as, $SiO_2$ or $SiN_x$. The insulating layer 808 has a thickness of a range 500~1500 Å, for example 700~1000 Å.

The functionalization layer 809 is used to enhance catalytic dissociation of the target element. Specifically, the functionalization layer 809 can decompose one or more target element in a medium and facilitate the target element in a type of ion with electron diffusing rapidly to the sensing area 804. The functionalization layer 809 is applied to improve the ability of sensing limit and/or selectivity of the sensing device 80. The material of the functionalization layer 809 is one or more suitable materials for the target element. For example, platinum is suitable for $H_2$ detection. Other material of the functionalization layer 809 can be platinum, palladium, gold, nickel, iridium, or metal oxide like as $SnO_x$, etc. The functionalization layer 809 has a thickness of a range 5~40 nm, for example 10~25 nm.

Figure 7:
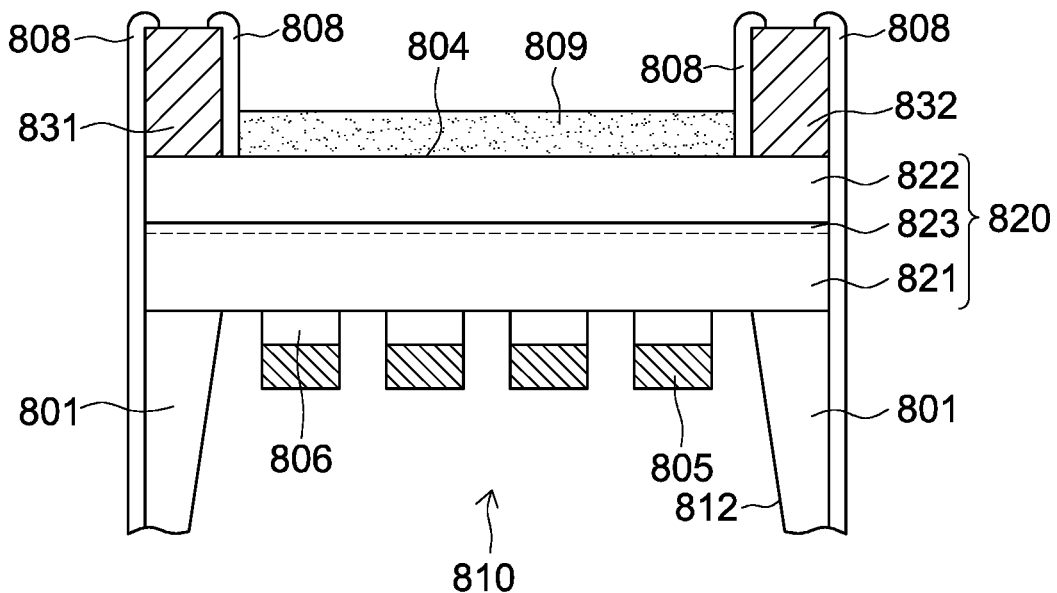
FIG. 7 shows a cross-sectional view of a sensing device in accordance with an embodiment of the present disclosure.

FIG. 7 shows a cross-sectional view of a sensing device 90 in accordance with an embodiment of the present disclosure. The difference between the sensing device 90 and the seconding device 80 is that the passivation layer 806 is sandwiched by the heater 805 and the hetero-junction structure 820.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A sensing apparatus, comprising:
   a sensing device comprising a heater, a hetero-junction structure, and a passivation layer sandwiched by the heater and the hetero-junction structure;
   a light coupler optically connected to the sensing device; and
   a readout device configured to read a current signal passing therethrough, and connected to the light coupler.

2. The sensing apparatus according to claim 1, wherein the light coupler comprises an LED connected with the sensing device.

3. The sensing apparatus according to claim 2, wherein the light coupler comprises a light receiver optically coupled to the LED.

4. The sensing apparatus according to claim 2, wherein the light coupler comprises a light receiver and a light guide physically connected between the LED and the light receiver.

5. The sensing apparatus according to claim 1, further comprising an amplifier connected with the readout device.

6. The sensing apparatus according to claim 1, further comprising a sensing area located on a trench of the sensing device.

7. A sensing apparatus, comprising:
   a sensing device comprising a hetero-junction structure, a heater, a sensing area located on the hetero-junction structure, and a passivation layer sandwiched by the heater and the hetero-junction structure;
   a light coupler having an LED connected to the sensing device;
   a first capacitor connected to the LED;
   a resistor connected to the light coupler, and a second capacitor connected to the resistor.

8. The sensing apparatus according to claim 7, further comprising a substrate below the hetero-junction structure.

9. The sensing apparatus according to claim 7, further comprising a functionalization layer on the hetero-junction structure.

10. The sensing device according to claim 7, further comprising an insulating layer, and an electrode separated from the functionalization layer by the insulating layer.

11. The sensing device according to claim 10, wherein the electrode is formed on the hetero-junction structure.

12. The sensing device according to claim 7, further comprising an insulating layer connected with the hetero-junction structure.

* * * * *